United States Patent [19]

Bramwell et al.

[11] Patent Number: 4,538,019

[45] Date of Patent: Aug. 27, 1985

[54] GROUNDING OF A CONTROL ROD EXTENDING THROUGH AN OPENING IN A STRUCTURE

[75] Inventors: Frank Bramwell, Hamden; John DeSouza, Shelton, both of Conn.

[73] Assignee: United Technologies Corporation, Hartford, Conn.

[21] Appl. No.: 605,323

[22] Filed: Apr. 30, 1984

[51] Int. Cl.³ .......................... H01R 4/66; H05K 9/00

[52] U.S. Cl. .......................................... 174/6; 74/18; 174/35 R

[58] Field of Search .............. 174/6, 35 R, 78, 152 G; 339/6 R, 7, 9 R, 14 L, 14 R; 74/17.8, 18, 18.1, 18.2; 200/305; 277/4; 403/69, 197

[56] References Cited

U.S. PATENT DOCUMENTS

| | | | |
|---|---|---|---|
| 2,404,539 | 7/1946 | Schmidt | 174/78 X |
| 2,410,999 | 11/1946 | Reisner | 174/78 X |
| 3,325,172 | 6/1967 | Herbold | 174/152 G X |
| 3,487,186 | 12/1969 | Johnson et al. | 200/305 |

FOREIGN PATENT DOCUMENTS

| | | | |
|---|---|---|---|
| 2741791 | 7/1978 | Fed. Rep. of Germany | 174/78 |
| 2052892 | 1/1981 | United Kingdom | 174/35 R |

*Primary Examiner*—Laramie E. Askin

*Attorney, Agent, or Firm*—Gerald E. Linden

[57] ABSTRACT

A control rod (10) is grounded to a structure (14) at an opening (16) through which it moves longitudinally by sliding contact with a conductive wiper (18, 29, 40, or 48). The wiper is mounted to the structure (14) by conductive arms (26) and brackets (28), or by a joint (36), or by a housing (44), or by a boot (50) so that the wiper can track transverse motion of the rod (10).

6 Claims, 4 Drawing Figures

FIG. 1
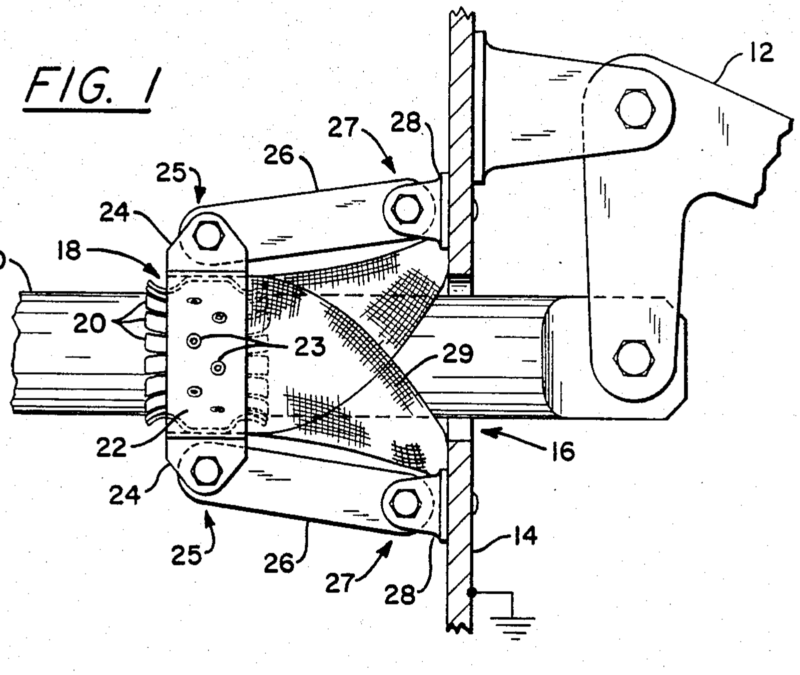
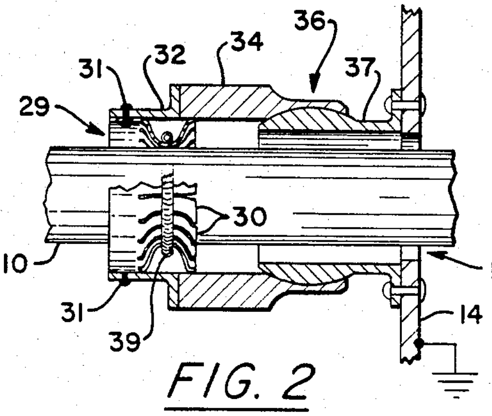
FIG. 2
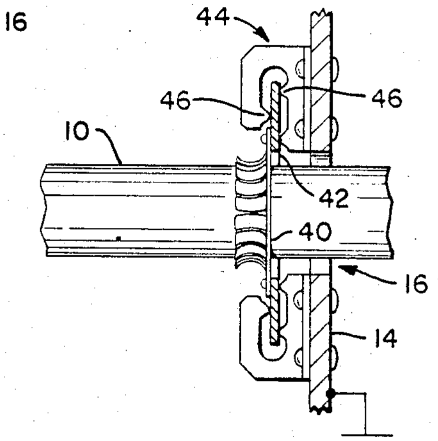
FIG. 3
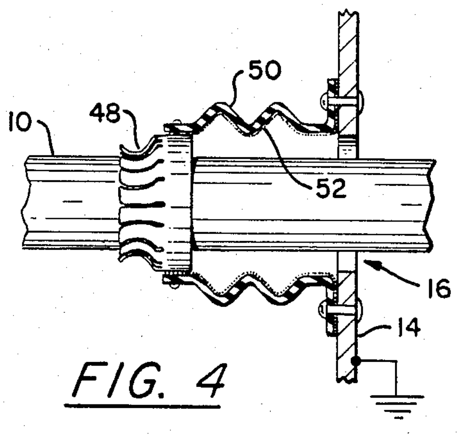
FIG. 4

GROUNDING OF A CONTROL ROD EXTENDING THROUGH AN OPENING IN A STRUCTURE

The Government has rights in this invention under contract No. N62269-83-C-0403 with the Department of the Navy.

DESCRIPTION

TECHNICAL FIELD

The invention relates to providing grounding for control rods and, more particularly, to applications where said rods pass through an opening in a grounded structure.

BACKGROUND OF THE INVENTION

When a control rod is operated by a bellcrank, some transverse motion accompanies the longitudinal control rod motion. Therefore, openings in structures through which the control rod passes must be large enough to accommodate the range of transverse control rod motions. In a metallic, grounded structure, such as an aircraft bulkhead, the openings allow the intrusion of electromagnetic energy which can cause interference with or damage to electronic equipment within the structure. Furthermore, an ungrounded (or inadequately grounded) control rod can act as an antenna, conducting and directing electromagnetic energy through an opening. It is known to connect one or more flexible metallic straps between the rod and the bulkhead at the opening to provide a low impedance ground path from the rod to the bulkhead. Each strap must be sufficiently long to allow for full control rod motion and is therefore slack at intermediate control rod positions, which can cause entanglement, especially in areas where rods are densely packed, since the form taken by the straps during operation cannot be predicted.

BRIEF DESCRIPTION OF THE INVENTION

Therefore, it is an object of this invention to provide for improved control rod grounding through structure openings while accommodating control rod motion.

According to the invention, a conductive wiper is in longitudinal sliding contact with the outside diameter of the control rod. The wiper is mounted in a transversely movable manner to the structure near the opening through which the control rod emerges. This provides a conductive path between the control rod and the structure while permitting both longitudinal and transverse motion of the control rod.

Other objects, features and advantages of this invention will become apparent in light of the teachings in the following description of the invention and accompanying drawings.

BRIEF DESCRIPTION OF THE DRAWINGS

FIG. 1 is a view, partially in cross section, of a grounding device of this invention; and FIG. 2 is a view, partially in cross section, of an alternate embodiment of the invention;

FIG. 3 is a view, partially in cross section, of an alternate embodiment of the invention; and FIG. 4 is a view, partially in cross section, of an alternate embodiment of the invention.

BEST MODE FOR CARRYING OUT THE INVENTION

FIG. 1 shows a control rod 10 attached at one end for longitudinal motion to a bellcrank 12 which is inside a metallic, grounded structure 14, such as an aircraft bulkhead. The bellcrank 12 also imparts some transverse (up and down as shown) motion to the rod 10. At the other end of the rod 10, another bellcrank (not shown) may impart motion to the rod 10 in another transverse axis (such as in and out of the page as shown). Therefore, an opening 16 through which the control rod 10 passes is large enough to accommodate transverse control rod motion. This clearance, as well as the control rod 10 acting as an antenna, can allow electromagnetic energy to pass from one side of the structure 14 to the other.

A conductive wiper 18 is formed from a resilient material, such as beryllium copper on the order of several thousandths of an inch in thickness. The wiper 18 has a plurality of arcuate fingers 20 in two rows and is bent around the control rod 10 so that there is continuous peripheral electrical contact while allowing for sliding (longitudinal motion) therebetween.

Although the fingers 20 are resilient, they cannot accommodate the full range of transverse control rod motion. Therefore, the wiper 18 is mounted in a movable manner to the structure 14. An annular clamp 22 surrounds the control rod 10 and holds the wiper 18 by suitable means, such as rivets 23, and has two flanges 24, 24 disposed evenly (180 degrees apart) about its circumference. Each flange 24 is pivotally attached by a ball joint 25 to one end of an arm 26, the other end of which is pivotally attached by a ball joint 27 to a bracket 28. The brackets 28, 28 are mounted evenly about the opening to the structure 14 adjacent to the opening 16. The articulated mounting of the clamp 24 allows for transverse motion of the wiper 18 relative to the structure 10 so that the wiper 18 can track the transverse motion of the rod 10. One arm 26 (and hence, one flange 24 and one bracket 28) would similarly achieve this purpose, but two arms 26, 26 provide better alignment and support for the clamp 22. Similarly, more than two arms could be used. Since the transverse motion of the control rod 10 is calculable, based on the bellcrank configuration and total longitudinal travel, the "envelope" (range of positions) of the clamp 22 and associated arms 26, 26 is predictable. Therefore, impingement or entanglement of the clamp 22 (and arms 26, 26) upon adjacent devices or control rods is avoidable.

The clamp 22, arms 26, 26, and brackets 28, 28 are all conductive so as to ground the control rod 10 to the structure 14. It is preferable to maintain the length of the arms 26, 26 as short as possible to reduce their impedance. For further protection against the intrusion of electromagnetic energy through the opening 16, a conductive metallic braid (boot) 29 is provided between the perimeter of the opening 16 and the circumference of the clamp 22. A feature of this invention is that the thinness of the wiper 18 which contributes to its resiliency also permits it to be torn away by control rod motion in the event of a seizure of the wiper 18 to the rod 10.

For ease of installation and maintenance the clamp 24, 24 can be two-piece, each half circumscribing approximately 180 degrees and the wiper 18 can be a strip that is bent around the entire periphery of the rod 10 without fastening its two ends together. Thus the wiper 18 could be replaced without disconnecting the rod 10 and necessitating readjustment thereof.

In an alternate embodiment, as shown in FIG. 2, a wiper 29, similar to the previously described wiper 18 but having only one row of fingers 30, is mounted, by suitable means such as rivets 31, to a conductive annular clamp 32 which surrounds the control rod 10 and is attached to the outer race 34 of a conductive ball joint 36, which also surrounds the control rod 10. The inner race 37 of the ball joint 36 is attached by suitable means to the structure 14. This arrangement accomodates the transverse control rod motions. Conductive grease is used in the ball joint 36 to enhance conductivity. Since the wiper 29 has only one row of fingers 30, an annular spring 39 may be used to increase tension and enhance contact between the fingers 30 and the control rod 10.

In another embodiment, as shown in FIG. 3, a wiper 40, similar to the previously described wiper 29, is attached to a conductive washer 42 which surrounds the rod 10. To accommodate transverse motion of the control rod 10, the washer 42 is free to slide within a conductive housing 44 which is similarly disposed about the rod 10 and attached to the structure 14 substantially in register with the opening 16. Sliding contact between the washer and the housing 44 is enhanced by dimples 46 or a thrust washer (not shown). As previously discussed, the wiper 40 is designed to tear away in the event of a failure, such as seizure to the rod 10.

In another embodiment, as shown in FIG. 4, a wiper 48, similar to the previously described wiper 29, is attached to one end of a flexible rubber boot 50 which surrounds the rod 10. At the other end, the boot 50 is attached to the structure 14. The inner surface 52 of the boot is either metallized or has a wire mesh bonded thereto so that there is a conductive path between the wiper 48 and the structure 14. The wiper 48 allows for longitudinal rod motion by sliding, while the boot 50 allows for transverse rod motions.

It should be understood that this description of the invention is intended to enable those skilled in the art to practice the invention and that various changes and additions may be made thereto without departing from the spirit and scope of the invention.

What is claimed is:

1. A structure having an opening therethrough, a control rod extending through said opening and being movable both longitudinally and transversely through the opening, and a grounding device providing an electrical path between said control rod and said structure;
   - said grounding device including a conductive wiper surrounding and resiliently contacting the control rod while allowing for longitudinal motion of the control rod in the wiper; and
   - mounting means attaching the wiper to the structure adjacent the opening while allowing for relative transverse motion between the wiper and the structure.

2. The combination according to claim 1 wherein the wiper comprises a row of fingers having arcuate ends contacting the control rod.

3. The combination according to claim 1 wherein the mounting means comprises:
   - a conductive clamp disposed about the control rod and holding the wiper; and
   - at least one conductive arm pivotally attached at one end to a clamp and pivotally attached at the other end to the structure.

4. The combination according to claim 1 wherein the mounting means comprises:
   - a conductive clamp disposed about the control rod and holding the wiper; and
   - a conductive ball joint disposed about the control rod and pivotally attaching the clamp to the structure.

5. The combination according to claim 1 wherein the mounting means comprises:
   - a conductive housing disposed about the control rod in contact with the structure; and
   - a conductive washer disposed about the control rod and holding the wiper, said washer being housed by and being in transverse sliding contact with the housing.

6. The combination according to claim 1 wherein the mounting means comprises:
   - a conductive flexible boot disposed about the control rod and attached at one end to the wiper and attached at the other end to the structure.

* * * * *